(12) United States Patent
Wu et al.

(10) Patent No.: US 7,205,234 B2
(45) Date of Patent: Apr. 17, 2007

(54) METHOD OF FORMING METAL SILICIDE

(75) Inventors: Chii-Ming Wu, Taipei (TW); Mei-Yun Wang, Hsin-Chu (TW); Chih-Wei Chang, Hsin-Chu (TW); Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 100 days.

(21) Appl. No.: 10/772,938

(22) Filed: Feb. 5, 2004

(65) Prior Publication Data

US 2005/0176227 A1 Aug. 11, 2005

(51) Int. Cl.
*H01L 21/44* (2006.01)
(52) U.S. Cl. .............. 438/683; 257/E21.593
(58) Field of Classification Search ........... 438/682, 438/683, 685, 663, 664; 257/E21.593
See application file for complete search history.

(56) References Cited

U.S. PATENT DOCUMENTS

| | | | |
|---|---|---|---|
| 5,047,367 A * | 9/1991 | Wei et al. .......... | 438/607 |
| 5,702,972 A * | 12/1997 | Tsai et al. .......... | 438/305 |
| 6,346,477 B1 | 2/2002 | Kaloyeros et al. .... | 438/680 |
| 6,423,619 B1 | 7/2002 | Grant et al. ........ | 438/589 |
| 6,468,901 B1 | 10/2002 | Maa et al. .......... | 438/655 |
| 6,511,867 B2 | 1/2003 | Lowrey et al. ....... | 438/128 |
| 6,767,831 B1 * | 7/2004 | Chu et al. .......... | 438/682 |
| 6,916,729 B2 * | 7/2005 | Fang et al. ......... | 438/583 |
| 2003/0170969 A1 * | 9/2003 | Ishida et al. ....... | 438/596 |
| 2005/0101132 A1 * | 5/2005 | Kim et al. | |

OTHER PUBLICATIONS

Maa, Jer-Shen, et al, "Effect of Interlayer on Thermal Stability of Nickel Silicide", J. Vac. Sci. Technol. A, vol. 19, No. 4, Jul./Aug. 2001, pp. 1595-1599.
Tan, W.L., et al., "Effect of a Titanium Cap in Reducing Interfacial Oxides in the Formation of Nickel Silicide", Journal of Applied Physics, vol. 91, No. 5, Mar. 1, 2002, pp. 2901-2909.

* cited by examiner

*Primary Examiner*—Bradley K. Smith
(74) *Attorney, Agent, or Firm*—Haynes and Boone, LLP

(57) ABSTRACT

A method of optimizing the formation of nickel silicide on regions of a MOSFET structure, has been developed. The method features formation of nickel silicide using an anneal procedure performed at a temperature below which nickel silicide instability and agglomeration occurs. A thin titanium interlayer is first formed on the MOSFET structure prior to nickel deposition, allowing an anneal procedure, performed after nickel deposition, to successfully form nickel silicide at a temperature of about 400° C. To obtain the desired conformality and thickness uniformity the thin titanium interlayer is formed via an atomic layer deposition procedure.

30 Claims, 3 Drawing Sheets

METHOD OF FORMING METAL SILICIDE

BACKGROUND OF THE INVENTION (1) Field of the Invention

The present invention relates to methods used to fabricate semiconductor devices and more specifically to a process used to form metal silicide on specific regions of metal oxide semiconductor field effect transistor (MOSFET) devices.

(2) Description of Prior Art

To improve MOSFET device performance metal silicide has been used on source/drain as well as on conductive gate structures. The use of the lower resistance metal silicide, when compared to more resistive non-silicided source/drain regions and polysilicon gate structures, result in he desired resistance—capacitance (RC) values allowing MOSFET performance enhancement to be realized. Candidates for metal silicide include titanium silicide as well as cobalt silicide, however both present shortcomings when used for MOSFET devices that are comprised with shallow source/drain regions and narrow width gate structures. The minimum resistance of titanium silicide is difficult to achieve sometimes necessitating several anneal cycles needed to obtain the low resistance C54 phase, specifically when titanium silicide is formed on the top surface of narrow width conductive gate structures. In addition during the consumption of silicon during metal silicide formation greater silicon consumption is encountered during cobalt silicide formation than experienced with other metal silicide counterparts thus presenting risks when shallow source/drain regions are employed.

Nickel silicide features desirable low resistance as well as consuming only minimal amounts of silicon during formation, however the attainment of nickel silicide can be more difficult to achieve than other metal silicides such as titanium silicide or cobalt silicide. Nickel silicide is unstable at temperatures greater than 750° C., sometimes resulting in an agglomeration phenomena, therefore an anneal procedure performed at these temperatures, applied to a nickel layer directly on a narrow width conductive gate structure can result in unwanted nickel silicide agglomeration. A method used to reduce the anneal temperature needed for nickel silicide formation is the employment of an interlayer material, a material placed between nickel and the underlying areas, a source/drain region as well as the conductive gate structure. An initial phase of an anneal procedure now performed at lower temperatures results in an intermediate silicide layer comprised of nickel and the interlayer material, while a final phase of the same anneal procedure performed with the intermediate silicide layer overlying the MOSFET regions source/drain region, results in the desired nickel silicide layer formed on the source/drain region as well as on the top surface of the conductive gate structure.

A shortcoming of the employment of the interlayer material, allowing nickel silicide to be formed at temperatures below which instability occurs, is the ability to form a thin, less than 20 Angstroms, interlayer material uniformly, and conformally across a semiconductor substrate. The present invention will describe formation of nickel silicide at a temperature in which nickel silicide instability is eliminated via use of a thin interlayer material uniformly obtained via a specific deposition mode. Prior art such as Maa et al, in U.S. Pat. No. 6,468,901 B1, Kaloyeros et al, in U.S. Pat. No. 6,346,477 B1, Lowery et al, in U.S. Pat. No. 6,511,867,B2, and Grant et al, in U.S. Pat. No. 6,423,619 B1, describe methods of forming MOSFET devices, metal silicide layers for MOSFET devices, as well as methods of depositing metal layers. However none of the above prior art describe the novel features of the present invention in which a thin interlayer material, formed uniformly via a specific deposition procedure, is used to allow nickel silicide to be formed on MOSFET device regions at a temperature in which instability of nickel silicide does not occur.

SUMMARY OF THE INVENTION

It is a object of this invention to form a metal silicide, such as nickel silicide on MOSFET device regions.

It is another object of this invention to employ a thin titanium interlayer on MOSFET regions such as source/drain regions as well as on the top surface of conductive gate structures, located underlying a nickel layer, allowing an anneal procedure used to form metal silicide to be performed at a temperature below which nickel silicide instability will not occur.

It is still another object of this invention to form the thin, less than 20 Angstroms, titanium interlayer, via an atomic layer deposition (ALD) procedure, to allow the desired thickness uniformity and conformality to be realized.

In accordance with the present invention a method of forming nickel silicide on MOSFET device regions wherein a thin, atomic layer deposited titanium interlayer, located between an overlying nickel layer and underlying MOSFET regions, is employed to reduce nickel silicide instability during the metal silicide anneal procedure, is described. A titanium layer between 10 to 15 Angstroms in thickness is deposited via an atomic layer deposition (ALD) procedure on a MOSFET device comprised with shallow source/drain regions, narrow conductive gate structures, and insulator spacers on the sides of the narrow gate structures. A nickel layer is next formed on the underlying titanium interlayer followed by a low temperature, rapid thermal anneal (RTA) procedure. A first phase of the RTA procedure results in blanket formation of a nickel-titanium layer, while a second phase of the same RTA procedure results in nickel silicide formation on source/drain regions and on the top surface of the narrow conductive gate structure. Portions of unreacted nickel-titanium, located on the surface of the insulator spacers are selectively removed.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
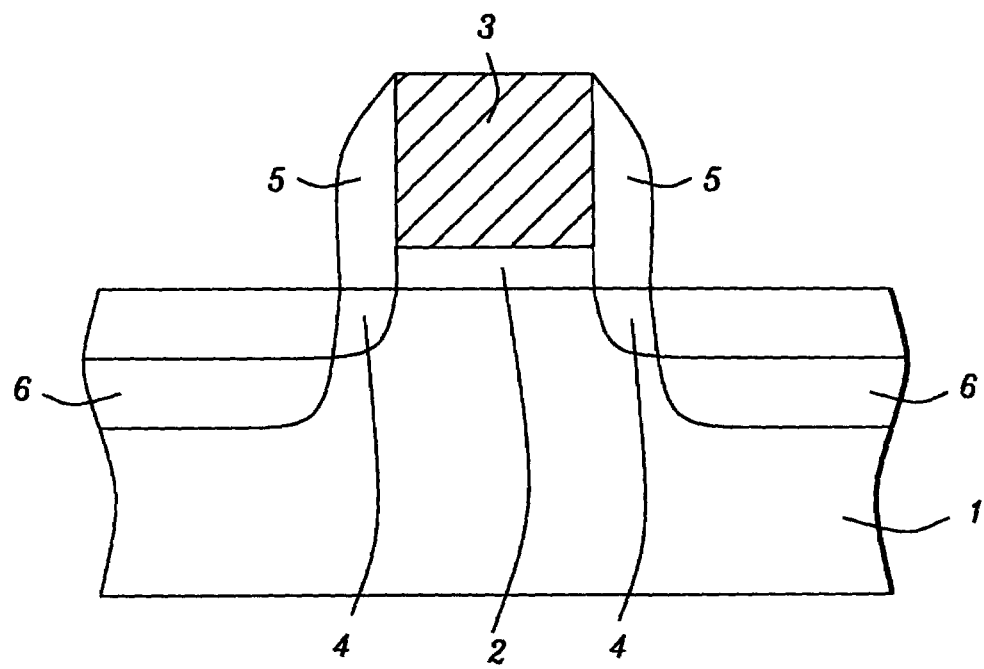
FIGS. 1–6, which schematically, in cross-sectional style show key stages used to form nickel silicide on MOSFET device regions wherein a thin, ALD titanium interlayer, located between an overlying nickel layer and underlying MOSFET regions, is employed to reduce nickel silicide instability during the anneal procedure used to form the nickel silicide regions.

The method of forming nickel silicide on MOSFET device regions featuring a thin titanium interlayer, obtained via ALD procedures and employed to allow nickel silicide to be formed at temperatures in which nickel silicide instability is eliminated, will now be described in detail. This invention will be described for an N channel MOSFET device, however it should be understood that this invention can also be applied to a P channel MOSFET as well as to a complimentary (CMOS) device. FIG. 1, schematically shows the MOSFET device to which this invention will be applied. P type semiconductor substrate 1, comprised of single crystalline silicon featuring a <100> crystallographic orientation is used. Gate insulator layer 2, comprised of silicon dioxide is thermally grown to a thickness between about 10 to 100 Angstroms. If desired a high dielectric constant (high k), layer, with a dielectric constant greater than 4, can be used as a gate insulator layer. Conductive gate structure 3, a structure comprised of a material such as a doped polysilicon is next formed initially via the deposition of a polysilicon layer at a thickness between about 500 to 3000 Angstroms via low pressure chemical vapor deposition (LPCVD) procedures. The polysilicon layer can be doped in situ during deposition via the addition of arsine or phosphine to a silane or to a disilane ambient, or the polysilicon layer can be deposited intrinsically than doped via implantation of arsenic or phosphorous ions. Photolithographic and anisotropic reactive ion etching (RIE) procedures are next employed, using $Cl_2$ as an etchant, to define conductive gate structure 3, featuring a width between about 0.01 to 10 um. After removal of the conductive gate structure defining photoresist shape, lightly doped source/drain region 4, is next formed via implantation of arsenic or phosphorous at an energy between about 0.1 to 100 KeV, at a dose between about 1E12 to 1E17 atoms/$cm^2$, in regions of semiconductor substrate 1, not covered by conductive gate structure 3. Insulator spacers 5, comprised of either silicon oxide or silicon nitride are next formed at a thickness between about 200 to 1500 Angstroms, on the sides of conductive gate structure 3. This is accomplished via deposition of either silicon oxide or silicon nitride using LPCVD or plasma enhanced chemical vapor deposition (PECVD) procedures, followed by an anisotropic RIE procedure using either $CHF_3$ or $CF_4$ as a selective etchant for the insulator layer. Heavily doped source/drain region 6, is next formed in portions of semiconductor substrate 1, not covered by conductive gate structure 3, or by insulator spacers 5, via implantation of arsenic or phosphorous ions at an energy between about 0.1 to 100 KeV, and at a dose between about 1E12 to 1E17 atoms/$cm^2$. The depth of heavily doped source/drain region 6, in semiconductor substrate 1, is between about 200 to 2000 Angstroms.

Figure 2:
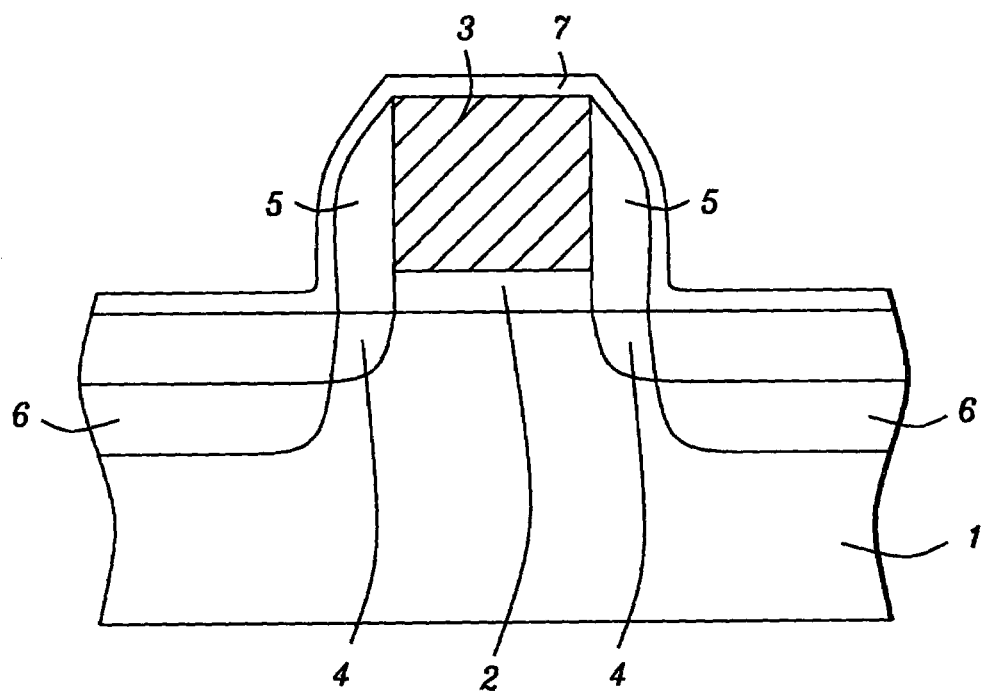

Preparation for nickel silicide formation is now addressed via formation of a thin, blanket titanium layer. The presence of titanium underlying a subsequently deposited nickel layer, will allow the anneal procedure used to form metal silicide to be performed at a temperature in which nickel silicide will not agglomerate or become unstable. However to be effective in reducing nickel silicide instability during the metal silicide formation anneal procedure the titanium interlayer must be maintained at a minimum thickness of between about 10 to 15 Angstroms, with excellent thickness uniformity. To insure the uniformity of the thin, titanium interlayer, an atomic layer deposition (ALD) procedure is employed to form titanium interlayer 7, at a thickness between about 10 to 15 Angstroms, with the ALD procedure providing the desired titanium comformality and thickness uniformity. This is schematically shown in FIG. 2.

Figure 3:
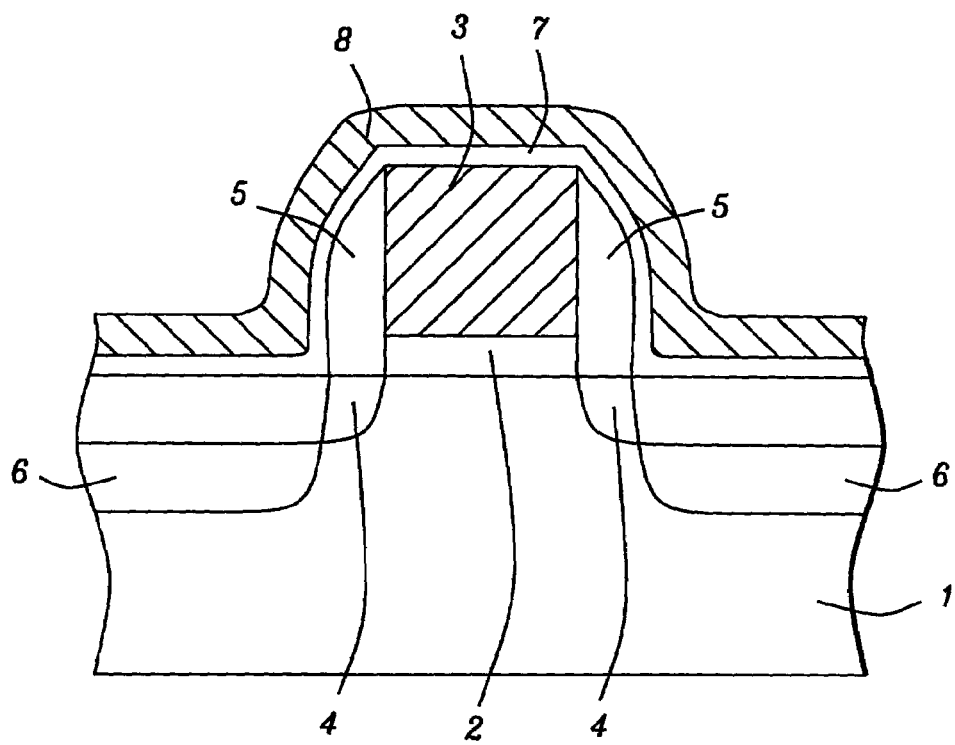
Figure 4:
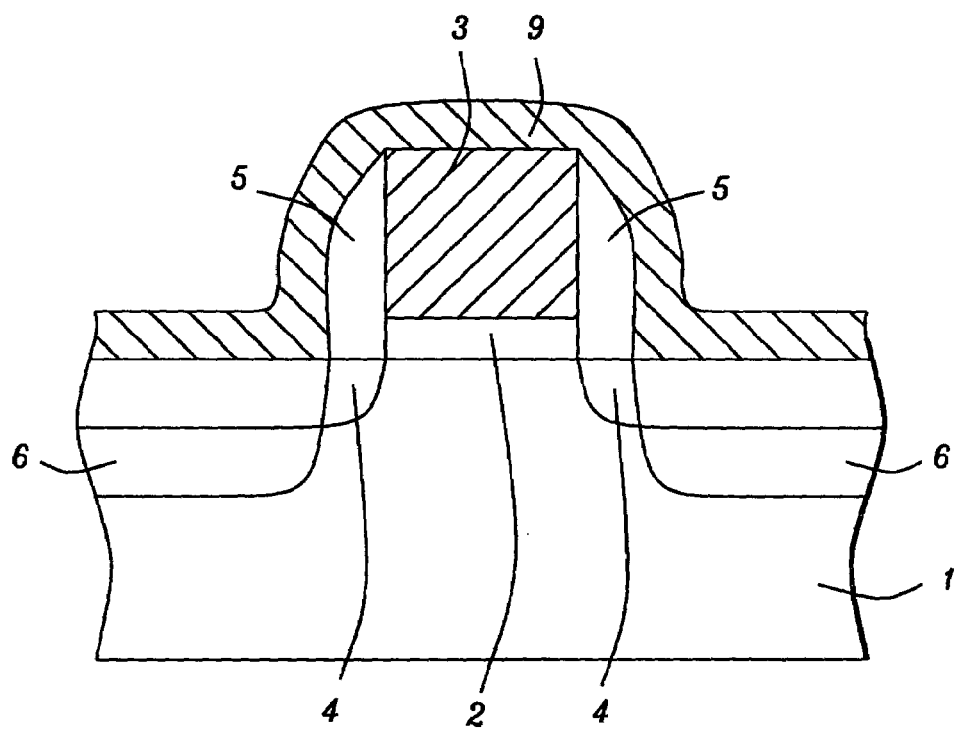
Figure 5:
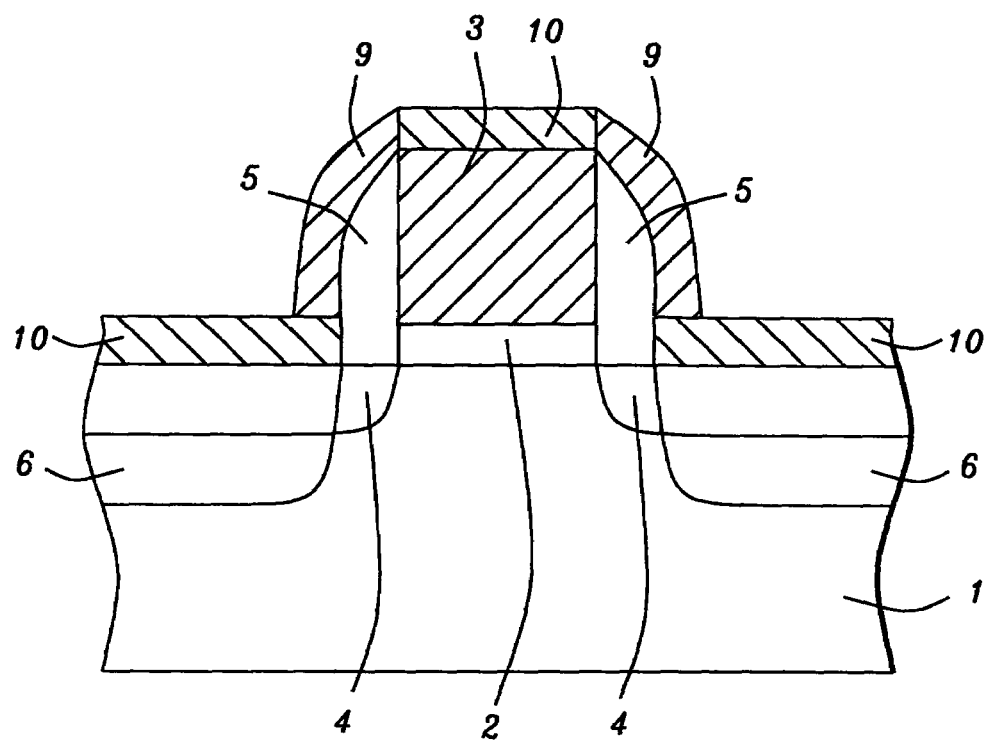

Nickel layer 8, is next formed via physical vapor deposition (PVD) procedures such as RF sputtering or evaporation, at a thickness between about 50 to 500 Angstroms. This is schematically shown in FIG. 3. An initial phase of a rapid thermal anneal (RTA) procedure is next performed a temperature between about 250 to 700° C., resulting in the formation of layer 9, wherein layer 9, is comprised of only nickel and incorporated titanium interlayer component. This is shown schematically in FIG. 4. Continuation of the RTA procedure, again performed at a temperature between about 250 to 700° C., results in the formation of nickel silicide regions 10, on non-insulator regions of the MOSFET device, specifically formation of nickel silicide regions 10, on heavily doped source/drain region 6, as well as on the top surface of narrow width, conductive gate structure 3. Portions of layer 9, again comprised of only nickel and titanium, residing on insulator spacers 5, remain unreacted. The result of the final phase of the RTA procedure is schematically shown in FIG. 5. If desired only a single RTA step can be used for nickel silicide formation, with the RTA temperature, ramp up rate and time being adjusted to accommodate a one step RTA procedure.

Figure 6:
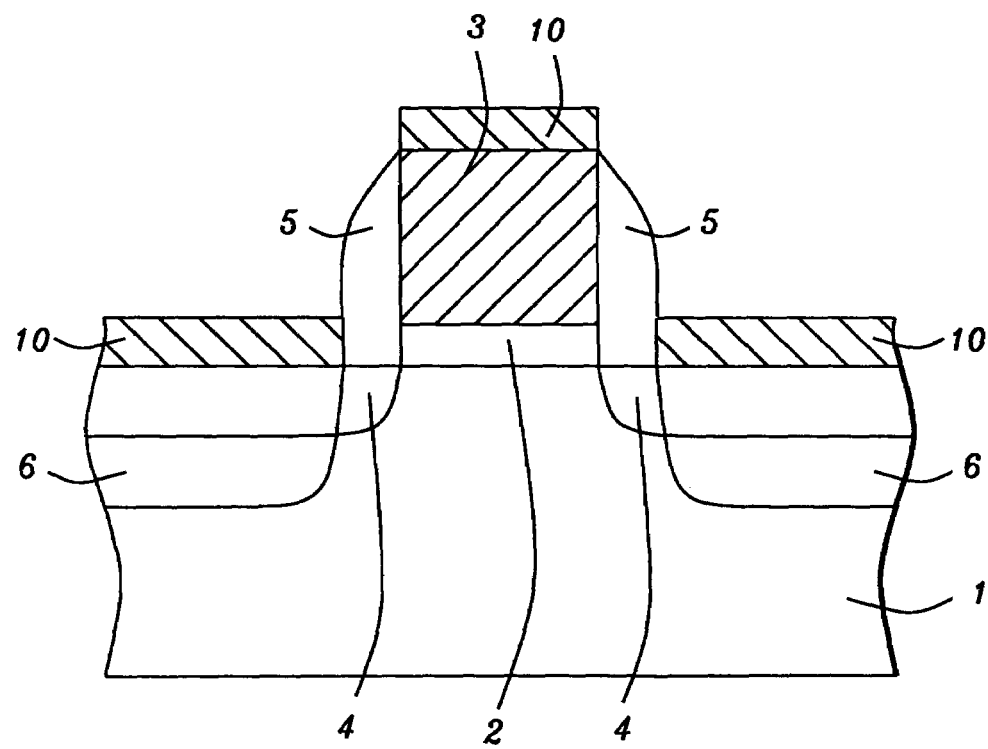

Removal of layer 9, the nickel-titanium layer, is next selectively accomplished via wet etch procedures using a mixture comprised of $H_2SO_4$—$H_2O_2$—HCl—$NHOH_4$—$H_3PO_4$—$HNO_3$—$CH_3COOH^-$, resulting in the desired nickel silicide regions on shallow depth, heavily doped source/drain region 6, and on narrow width, conductive gate structure 3. This is schematically shown in FIG. 6. The attainment of nickel silicide was accomplished via an anneal procedure performed at a temperature below which unwanted agglomeration occurs. However to be able to form nickel silicide at a low RTA temperature a thin, titanium interlayer was needed. Of upmost importance however was the ability to uniformly and conformally deposit the thin titanium interlayer which was accomplished via ALD procedures. It should be noted that this procedure, the use of a thin titanium interlayer for nickel silicide formation, can also be applied to formation of other metal silicide layers, such as cobalt silicide.

While this invention has been particularly shown and described with reference to, the preferred embodiments thereof, it will be understood by those skilled in the art that various changes in form and details may be made without departing from the spirit and scope of this invention.

The invention claimed is:

1. A method of forming metal silicide on regions of a metal oxide semiconductor field effect transistor (MOSFET) device, comprising the steps of:
   providing a MOSFET device on a semiconductor substrate comprised with a conductive gate structure on an underlying gate insulator layer and with a heavily doped source/drain region located in an area of said semiconductor substrate not covered by said conductive gate;
   forming an interlayer material on said MOSFET device having a thickness less than 15 Angstroms;
   forming a metal layer on said interlayer material;
   performing an anneal procedure to form said metal silicide on said heavily doped source/drain region and on top surface of said conductive gate structure, while forming a layer comprised of said metal layer and said interlayer material on insulator spacers located on sides of said conductive structure; and
   removing said layer comprised of said metal layer and said interlayer material from insulator spacers.

2. The method of claim 1, wherein said gate insulator layer is a silicon dioxide layer obtained via thermal oxidation procedures at a thickness between about 10 to 100 Angstroms, or said gate insulator layer can be a high k dielectric constant (high k) layer, with a dielectric constant greater than 4.

3. The method of claim 1, wherein said conductive gate structure is a polysilicon gate structure at a thickness between about 500 to 3000 Angstroms.

4. The method of claim 1, wherein said conductive gate structure is comprised with a width between about 0.01 to 10 um.

5. The method of claim 1, wherein said insulator spacers are comprised of silicon oxide or silicon nitride, at a thickness between about 200 to 1500 Angstroms.

6. The method of claim 1, wherein said heavily doped source/drain region is formed at a depth between about 200 to 2000 Angstroms in said semiconductor substrate.

7. The method of claim 1, wherein said interlayer material is titanium.

8. The method of claim 7, wherein said titanium layer is obtained at a thickness between about 10 to 15 Angstroms, via atomic layer deposition (ALD) procedures.

9. The method of claim 1, wherein said metal layer is a nickel layer obtained via physical vapor deposition procedures at a thickness between about 50 to 500 Angstroms.

10. The method of claim 1, wherein said anneal procedure is a rapid thermal anneal (RTA) procedure, performed at a temperature between about 250 to 700° C.

11. A method of forming nickel silicide on regions of a MOSFET device, comprising the steps of:
  providing a MOSFET device on a semiconductor substrate comprised with a polysilicon gate structure on an underlying silicon dioxide gate insulator layer, with insulator spacers on sides of said polysilicon gate structure, and with a heavily doped source/drain region located in an area of said semiconductor substrate not covered by said polysilicon gate structure or by said insulator spacers;
  forming a titanium interlayer on said MOSFET device having a thickness less than 15 Angstroms;
  forming a nickel layer on said titanium interlayer;
  performing a rapid thermal anneal (RTA) procedure to form said nickel silicide on said heavily doped source/drain region and on top surface of said polysilicon gate structure, while forming a nickel-titanium layer on said insulator spacers; and
  selectively removing said nickel-titanium layer from insulator spacers.

12. The method of claim 11, wherein said silicon dioxide gate insulator layer is obtained via thermal oxidation procedures at a thickness between about 10 to 100 Angstroms.

13. The method of claim 11, wherein said polysilicon gate structure is comprised with a thickness between about 500 to 3000 Angstroms.

14. The method of claim 11, wherein said polysilicon gate structure is comprised with a width between about 0.01 to 10 um.

15. The method of claim 11, wherein said insulator spacers are comprised of silicon oxide or silicon nitride, at a thickness between about 200 to 1500 Angstroms.

16. The method of claim 11, wherein said heavily doped source/drain region is formed to a depth between about 200 to 2000 Angstroms in said semiconductor substrate.

17. The method of claim 11, wherein said titanium interlayer is obtained at a nearly uniform thickness via atomic layer deposition (ALD) procedures.

18. The method of claim 11, wherein said nickel layer is obtained via physical vapor deposition procedures at a thickness between about 50 to 500 Angstroms.

19. The method of claim 11, wherein said RTA procedure is performed at a temperature between about 250 to 700° C.

20. A method of forming nickel silicide on regions of a MOSFET device featuring a titanium interlayer obtained via atomic layer deposition procedures, wherein said titanium interlayer is used to optimize nickel silicide formation, comprising the steps of:
  providing a MOSFET device on a semiconductor substrate comprised with a polysilicon gate structure on an underlying silicon dioxide gate insulator layer, with insulator spacers on sides of said polysilicon gate structure, and with a heavily doped source/drain region located in an area of said semiconductor substrate not covered by said polysilicon gate structure or by said insulator spacers;
  performing said atomic layer deposition procedure to form said titanium interlayer on said MOSFET device, with said titanium interlayer formed at a thickness between about 10 to 15 Angstroms;
  forming a nickel layer on said titanium interlayer;
  performing said rapid thermal anneal (RTA) procedure to form said nickel silicide on said heavily doped source/drain region and on top surface of said polysilicon gate structure, while forming a nickel-titanium layer on said insulator spacers; and
  selectively removing said nickel-titanium layer from insulator spacers.

21. The method of claim 20, wherein said silicon dioxide gate insulator layer is obtained via thermal oxidation procedures to a thickness between about 10 to 100 Angstroms.

22. The method of claim 20, wherein said polysilicon gate structure is comprised with a thickness between about 500 to 3000 Angstroms.

23. The method of claim 20, wherein said polysilicon gate structure is comprised with a width between about 0.01 to 10 um.

24. The method of claim 20, wherein said insulator spacers are comprised of silicon oxide or silicon nitride, at a thickness between about 200 to 1500 Angstroms.

25. The method of claim 20, wherein said heavily doped source/drain region is formed to a depth between about 200 to 2000 Angstroms in said semiconductor substrate.

26. The method of claim 20, wherein said nickel layer is obtained via physical vapor deposition procedures at a thickness between about 50 to 500 Angstroms.

27. The method of claim 20, wherein said RTA procedure is performed at a temperature between 250 to 700° C., with a preferred temperature between about 300 to 450° C.

28. A semiconductor device comprising:
  a semiconductor substrate;
  a metal oxide semiconductor field effect transistor (MOSFET) device formed in the substrate, comprising a conductive gate structure on an underlying gate insulator layer with a heavily doped source/drain region; and
  a nickel silicide layer over the MOSFET, the nickel silicide layer formed by annealing a nickel layer adjacent a single titanium layer, the single titanium layer having a near uniform thickness less than about 15 Angstroms.

29. The semiconductor device of claim 28, wherein the thickness of the titanium layer is between about 10–15 Angstroms.

30. The semiconductor device of claim 28, wherein the titanium layer is formed by atomic layer deposition.

* * * * *